United States Patent [19]

Scherer

[11] 4,266,090
[45] May 5, 1981

[54] ALL METAL FLAT PACKAGE
[75] Inventor: Jeremy D. Scherer, South Dartmouth, Mass.
[73] Assignee: Isotronics, Incorporated, New Bedford, Mass.
[21] Appl. No.: 942,334
[22] Filed: Sep. 14, 1978
[51] Int. Cl.³ ............................................. H05K 5/04
[52] U.S. Cl. ................... 174/52 FP; 29/588; 357/74
[58] Field of Search ........... 174/52 FP, 16 HS, 50.61, 174/50.56; 357/74, 81; 29/588

[56] References Cited
U.S. PATENT DOCUMENTS

| | | |
|---|---|---|
| 2,880,383 | 3/1959 | Taylor .............................. 174/52 FP |
| 3,190,952 | 6/1965 | Bitko ................................ 174/52 FP |
| 3,548,076 | 12/1970 | Cooke et al. ..................... 174/52 FP |
| 3,733,691 | 5/1973 | Mann ...................................... 29/588 |
| 3,988,825 | 11/1976 | Fuchs et al. ........................... 29/622 |
| 4,063,348 | 12/1977 | Borden et al. ......................... 29/588 |

Primary Examiner—Thomas J. Kozma
Assistant Examiner—D. A. Tone
Attorney, Agent, or Firm—Schuyler, Banner, Birch, McKie & Beckett

[57] ABSTRACT

An all-metal flat package for microcircuits is described which has a molybdenum bottom and a Kovar frame. Large 96% alumina substrates carrying heat dissipating microcircuits can readily be soldered into the package which has good transfer characteristics.

7 Claims, 3 Drawing Figures

ALL METAL FLAT PACKAGE

BACKGROUND OF THE INVENTION

This invention relates to microcircuit packages and more particularly to all-metal flat packages for microcircuits.

All-metal flat packages normally include three major metal components. The first component is a frame which generally is a continuous ring of metal that extends around the periphery of the package and which forms the side walls of the package. Electrical leads extending through the frame constitute the second component of the flat package. Most often the leads pass through two opposing sides of the package and are normally glass-sealed within holes in the frame. The third component of the package is the bottom upon which the microcircuit substrate is affixed. In addition to these three components, there is, of course, a lid which is attached after the microcircuit has been installed in the package.

Normally, all-metal microcircuit packages which are flat packages are made of Kovar, with the Kovar frame and bottom often being joined together by a high temperature copper braze Kovar is a trademark of the Westinghouse Corporation for an iron-nickel-cobalt alloy (29% nickel, 17% cobalt, 53% iron, 1% minor ingredients). Indeed Kovar flat packages comprise a great majority of the all-metal flat packages made in the world. Kovar is the likely choice for making all-metal flat packages since leads readily can be glass sealed in Kovar and since its coefficient of thermal expansion closely matches 96% alumina, the material normally used for microcircuit substrates which are housed in the packages. Since the coefficient of expansion of Kovar closely approximates that of alumina, the alumina substrate may be soldered to the Kovar package.

While Kovar has good glass-sealing and thermal expansion properties, it has a very low coefficient of thermal conductivity, about 0.04 Cal/Cm$^2$/CM/Sec/°C. This presents a problem of heat dissipation from power chips through the bottom of the flat package to a heat sink. About the only practical way to reduce the thermal impedence of an all-Kovar flat package is to employ a thin bottom, thereby reducing the length of the heat path from the substrate of the microcircuit chip to the heat sink. Such technique, however, reduces the strength of the package bottom.

DESCRIPTION OF THE INVENTION

One object of the present invention is to provide a flat package for microcircuits having a Kovar frame that is characterized by good heat transfer properties.

It is another object of this invention to provide a flat package for microcircuits having good heat transfer characteristics that permit a single alumina substrate to be soldered to its base.

This invention embraces an all-metal flat package for microcircuits having a molybdenum bottom with plating sintered thereon at least in areas of contact between the bottom and a Kovar frame which is brazed to said bottom. Electrical leads are glass-sealed in the Kovar frame.

In another embodiment, this invention contemplates the method of providing a flat package for microcircuits comprising glass-sealing electrical leads in a Kovar frame and thereafter brazing the Kovar frame at a temperature below about 500° C. to a molybdenum bottom having a plating sintered thereon at least in the areas of contact between the molybdenum bottom of the Kovar frame.

The microcircuit package provided by this invention permits the use of a single 96% alumina substrate which carries one or more power chips and related circuitry. The substrate can be soldered to the bottom of the package to provide a reliable bond in a flat package that has good heat transfer properties.

By combining a Kovar with a molybdenum bottom, the package of this invention incorporates the benefits of Kovar with the benefits of molybdenum. Kovar permits reliable glass-sealing of electrical leads and ready attachment of covers by welding. These are important package considerations. As discussed earlier, however, Kovar has poor heat transfer characteristics.

Molybdenum has a coefficient of thermal expansion sufficiently close to 96% alumina to permit microcircuits carried on a single alumina substrate to be soldered to the molybdenum base. This is true even though the alumina substrate has one or more dimensions that exceed one-half inch. Moreover, molybdenum is characterized by a good heat transfer rate which is about 0.34/Cal/Cm$^2$/Cm/Sec/°C., or over 8 times the rate of Kovar. While molybdenum has a coefficient of thermal expansion that approximates that of 96% alumina and has good heat transfer properties, molybdenum is an expensive metal, cannot readily be glass-sealed, and does not readily lend itself to welding (for cover attachment or the like) because of its high melting point.

In order to join the Kovar frame to the molybdenum bottom in a feasible manner, the molybdenum bottom is plated and is then sintered. Suitable platings include for example nickel, gold, or any similar plating which can be easily sintered into the molybdenum. In the case of nickel, sintering can be accomplished at a temperature of about 350° to 400° C. in either an inert atmosphere or a vacuum. Both plating and sintering can be accomplished employing techniques known in the art. The sintered area of the molybdenum includes at least the area in contact with the Kovar frame but can include a larger area on one or both surfaces of the molybdenum bottom.

The ability of a flat package to dissipate heat requires a truly flat bottom for a good connection to an external heat sink. The coefficient of expansion of molybdenum and Kovar are not identical and, in accordance with this invention, the Kovar frame and the molybdenum bottom are joined by brazing at a temperature below about 500° C. In order to provide a hermetic package, the brazing forms a continuous seal between the frame and the bottom. While brazing at higher temperatures provides a reliable joint, processing at a temperature above about 500° C. can create sufficient stresses to introduce undesirable irregularities in the bottom when the unit cools. Suitable brazes which can be employed in the practice of this invention include gold/tin, gold/germanium, lead/silver and the like.

Further, in accordance with this invention, the electrical leads are glass-sealed in the Kovar frame before the frame is brazed to the molybdenum bottom. This permits effective assembly of the leads, frame and bottom without subjecting the assembled frame and bottom to temperatures above about 500° C. Glass-sealing of electrical leads in Kovar is, of course, well known in the art.

After the molybdenum bottom and Kovar frame with electrical leads are assembled, the package is ready for the installation of the alumina substrate. The substrate carries electrical components and is provided with terminal areas to which the electrical leads which pass through the Kovar frame are attached. The substrate may be soldered to the molybdenum bottom and the electrical leads may be soldered or wire bonded to the appropriate terminal areas. The attachment of the alumina substrate to the molybdenum bottom and the electrical leads to the terminals may be accomplished employing standard solders including, for example, tin/lead, gold/tin, gold/germanium, or any other solder or braze which is compatible with the surface of the two materials being joined which has a lower melting point than the solder or braze being used for the attachment of the bottom of the package.

As indicated earlier, the alumina substrate can have one or more dimensions that exceed one-half inch and can carry heat generating microcircuits which require that the heat be dissipated. Typical heat generating microcircuits include power chips such as voltage regulators, voltage dividers and the like. Power chips are, of course, well known in the art.

After the substrate is mounted in the package and the electrical connections are made, a lid is affixed to the package to provide a hermetic seal. The lid is preferably made of Kovar and may be attached by welding, soldering or by adhesive. Welding is often preferred.

The invention may be better understood with reference to the attached drawings.

Figure 1:
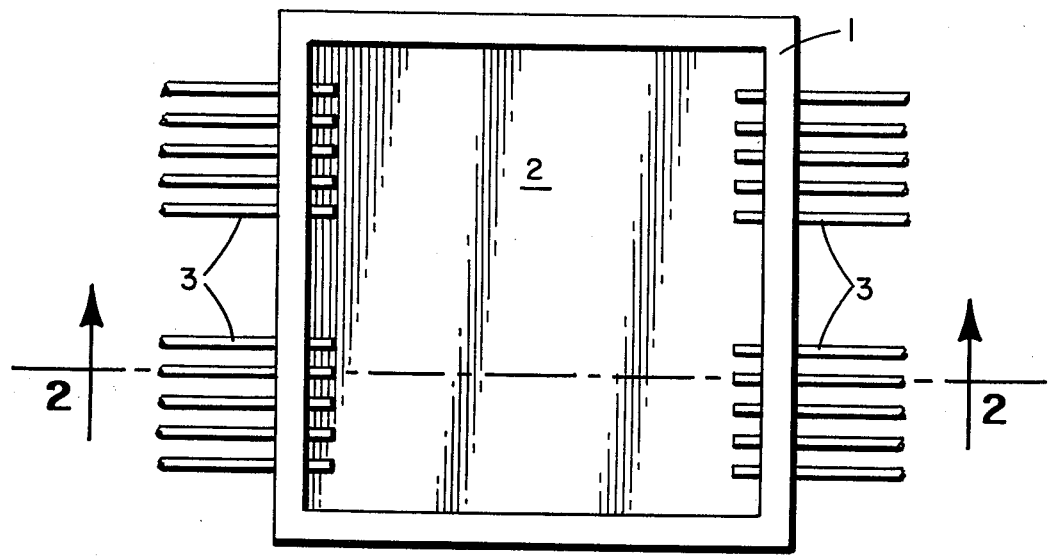
FIG. 1 is a plan view of a frame, bottom and leads of a flat package.
Figure 2:
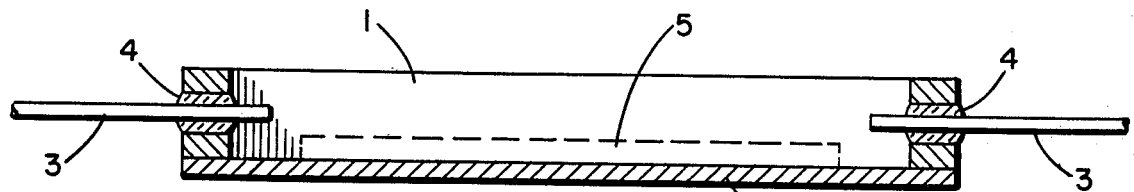
FIG. 2 is a sectional view taken along line 2—2 of FIG. 1.
Figure 3:
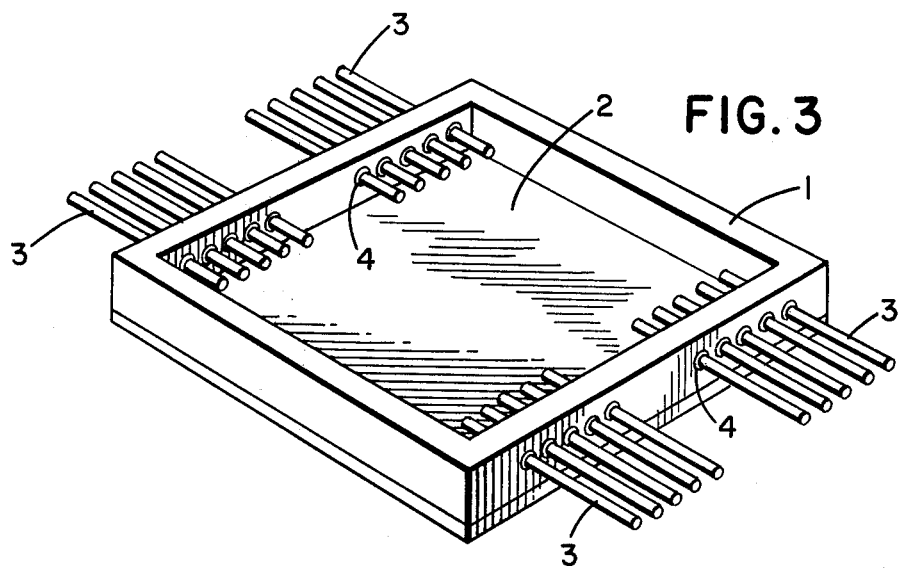
FIG. 3 is a perspective view of the flat package.

The flat package depicted in the drawings consists of Kovar frame 1 with molybdenum bottom 2 and electrical leads 3. The electrical leads are glass sealed in openings in the Kovar frame with glass seals 4. A 96% alumina substrate 5 carrying one or more power chips may be soldered to the bottom of the flat package as shown with dotted lines in FIG. 2.

The size and configuration of a flat package varies depending on the specific application. The package may be square, rectangular or some other shape. The number of electrical leads will also vary depending on the specific application. The leads may be sealed in one or more sides of the flat package. In a typical 1 inch (2.54 cm) by 1 inch (2.54 cm) package, the bottom may be 0.02 inches (0.05 cm) thick while the frame may be 0.04 inches (0.1 cm) thick and 0.130 inches (0.33 cm) high. The choice of dimensions for any given flat package is within the skill of the routineer.

Since modifications of this invention will be apparent to those skilled in the art, it is intended that this invention be limited only by the scope of the appended claims.

I claim:

1. The method of manufacturing a flat package for electric microcircuits comprising:
    glass-sealing electrical leads in apertures in a Kovar frame, and thereafter brazing said frame at a temperature below about 500° C. to a molybdenum bottom having a plating sintered thereon at least in the areas of contact between the molybdenum bottom and the Kovar frame.

2. The method of claim 1 wherein said plating is a sintered nickel coating.

3. The method of claim 1 where said plating is a sintered gold coating.

4. A flat package for electric microcircuits comprising:
    (a) a Kovar frame having electric leads extending therethrough, said leads being glass-sealed therein;
    (b) a molybdenum bottom, said molybdenum bottom having a sintered plating at least in the area in contact with said Kovar frame;
    (c) said Kovar frame forming the side walls of the package and being brazed to said molybdenum bottom to form a continuous seal between said frame and said bottom; and
    (d) said brazing having been accomplished after the electrical leads were glass-sealed in said frame at and a temperature below about 500° C.

5. The package of claim 4 containing a microcircuit on a 96% alumina substrate which is soldered to said bottom.

6. The package of claim 5 wherein a power chip is mounted on said 96% alumina substrate.

7. The microcircuit package of claim 4 containing a Kovar lid which is welded to said frame.

* * * * *